US008151149B2

(12) United States Patent
Lee et al.

(10) Patent No.: US 8,151,149 B2
(45) Date of Patent: Apr. 3, 2012

(54) SEMICONDUCTOR MEMORY APPARATUS AND METHOD OF TESTING THE SAME

(75) Inventors: Jeong-Hun Lee, Gyeonggi-do (KR); Yong-Mi Kim, Gyeonggi-do (KR); Jeong-Tea Hwang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 64 days.

(21) Appl. No.: 12/649,743

(22) Filed: Dec. 30, 2009

(65) Prior Publication Data

US 2010/0332925 A1    Dec. 30, 2010

(30) Foreign Application Priority Data

Jun. 29, 2009 (KR) .................. 10-2009-0058648
Dec. 22, 2009 (KR) .................. 10-2009-0129003

(51) Int. Cl.
*G11C 29/00* (2006.01)

(52) U.S. Cl. ........................ 714/718; 365/201
(58) Field of Classification Search .................. None
See application file for complete search history.

(56) References Cited

U.S. PATENT DOCUMENTS

| | | | | |
|---|---|---|---|---|
| 5,396,498 A * | 3/1995 | Lestrat et al. | ............. | 714/703 |
| 5,566,344 A * | 10/1996 | Hall et al. | ............. | 712/37 |
| 5,726,990 A * | 3/1998 | Shimada et al. | ............. | 370/536 |
| 5,983,379 A * | 11/1999 | Warren | ............. | 714/727 |
| 6,052,806 A * | 4/2000 | Beat | ............. | 714/718 |
| 6,249,893 B1 * | 6/2001 | Rajsuman et al. | ............. | 714/741 |
| 6,407,963 B1 * | 6/2002 | Sonoda et al. | ............. | 365/233.5 |
| 6,430,702 B1 * | 8/2002 | Santeler et al. | ............. | 714/6.22 |
| 6,728,162 B2 * | 4/2004 | Lee et al. | ............. | 365/233.1 |
| 6,885,599 B2 * | 4/2005 | Saitoh et al. | ............. | 365/201 |
| 6,907,555 B1 * | 6/2005 | Nomura et al. | ............. | 714/719 |
| 6,928,596 B2 * | 8/2005 | Kimura et al. | ............. | 714/718 |
| 7,454,672 B2 | 11/2008 | Lee et al. | | |
| 7,739,560 B2 * | 6/2010 | Saito | ............. | 714/710 |
| 2002/0041529 A1 * | 4/2002 | Fujiwara et al. | ............. | 365/201 |
| 2004/0151039 A1 | 8/2004 | Lee et al. | | |
| 2005/0207245 A1 * | 9/2005 | Kang | ............. | 365/201 |
| 2007/0030814 A1 | 2/2007 | Shin et al. | | |
| 2007/0070743 A1 * | 3/2007 | Do et al. | ............. | 365/201 |
| 2008/0052573 A1 * | 2/2008 | Pekny | ............. | 714/724 |

FOREIGN PATENT DOCUMENTS

| | | |
|---|---|---|
| JP | 09-145803 | 6/1997 |
| KR | 10-0721582 | 5/2007 |

* cited by examiner

*Primary Examiner* — Steve Nguyen
(74) *Attorney, Agent, or Firm* — Venable LLP; Jeffri A. Kaminski

(57) ABSTRACT

A semiconductor memory apparatus according to the embodiment includes a test mode controller, a first data alignment unit, a decoder, a test executing unit and a second data alignment unit. The test mode controller is configured to generate test enable signals in response to a test mode setting signal and a read command. The first data alignment unit is configured to parallely align first input data that are input in series, generate first alignment data, and transmit it to the first data driver. The decoder is configured to decode the first alignment data in response to the test enable signal and generate the decoding signal. The test executing unit is configured to execute the preset test mode in response to the decoding signal. The second data alignment unit is configured to parallely align second input data, which are input in series, in response to the test enable signal, generate second alignment data, and transmit it to a second data driver.

6 Claims, 6 Drawing Sheets

SEMICONDUCTOR MEMORY APPARATUS AND METHOD OF TESTING THE SAME

CROSS-REFERENCES TO RELATED PATENT APPLICATION

The present application claims priority under 35 U.S.C. 119(a) to Korean Application No 10-2009-0058648, filed on Jun. 29, 2009, and Korean Application No 10-2009-0129003, filed on Dec. 22, 2009, in the Korean Intellectual Property Office, which is incorporated herein by reference in its entirety as set forth in full.

BACKGROUND

1. Technical Field

The embodiment described herein relates to a semiconductor memory apparatus and, more specifically, to a semiconductor memory apparatus for improving area efficiency and a method of testing the same.

2. Related Art

Generally, in order to manufacture a semiconductor memory apparatus, a testing step is required to be performed because simulation results used for design and operation of chips used for an actual product may differ from each other. In order to actually reduce the defect rate of the semiconductor memory apparatus, various kinds of tests have been performed. Each test is performed by coding test codes of a plurality of bits that are input when a mode register set circuit defines a test mode. To this end, the semiconductor memory apparatus includes a decoder, which decodes the test codes of the plurality of bits to execute preset test modes.

The semiconductor memory apparatus according to the related art should include a plurality of signal transmission lines that transmit the test codes of the plurality of bits to the decoder in order to execute the test mode. However, the signal transmission lines should be long in length to be connected when considering the structure of a general semiconductor memory apparatus and thus, it is difficult to secure the stability of power supply of each signal line. In addition, as the integration of the semiconductor memory apparatus is gradually increased, it becomes difficult to secure enough space to arrange the signal lines. As such, the transmission lines for a large number of test codes provided for executing the test reduce the integration of the semiconductor memory apparatus, such that the high integration of the semiconductor memory apparatus reaches its limit.

SUMMARY

The disclosed embodiment provides a semiconductor memory apparatus capable of improving area efficiency and a method of testing the same.

A semiconductor memory apparatus according to one embodiment includes: a test mode controller that generates a test enable signal in response to a test mode setting signal and a read command; a first data alignment unit that generates first alignment data by parallely aligning first input data that are input in series, and transmits them to a first data driver; a decoder that decodes the first alignment data in response to the test enable signal to generate decoding signals; a test executing unit that executes preset test modes in response to the decoding signals; and a second data alignment unit that generates second alignment data by parallely aligning second input data that are input in series in response to the test enable signals and transmits them to a second data driver.

A method of testing a semiconductor memory apparatus according to one embodiment includes: a) enabling test enable signals in response to a test mode setting signal; b) deactivating operations of data alignment units other than one data alignment unit in response to the test enable signals; c) executing test operations by inputting test codes to the activated data alignment unit and decoding signals output therefrom; and d) disabling the test enable signals in response to an input of a read command.

A method of testing a semiconductor memory apparatus, comprising: a) deactivating operations of data alignment units other than one data alignment unit upon testing; b) generating parallel data by inputting serial data to the activated data alignment unit and decoding the parallel data; c) performing a test by enabling a test mode signal corresponding to the decoded result; d) generating and decoding parallel data by inputting serial data different from the serial data in the state where the enabled test mode signal is maintained; and e) simultaneously performing a test defined at c) and a test defined at d) by enabling a test mode signal corresponding to a result decoded at d).

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Hereinafter, preferred embodiments will be described in more detail with reference to the accompanying drawings.

Figure 1:
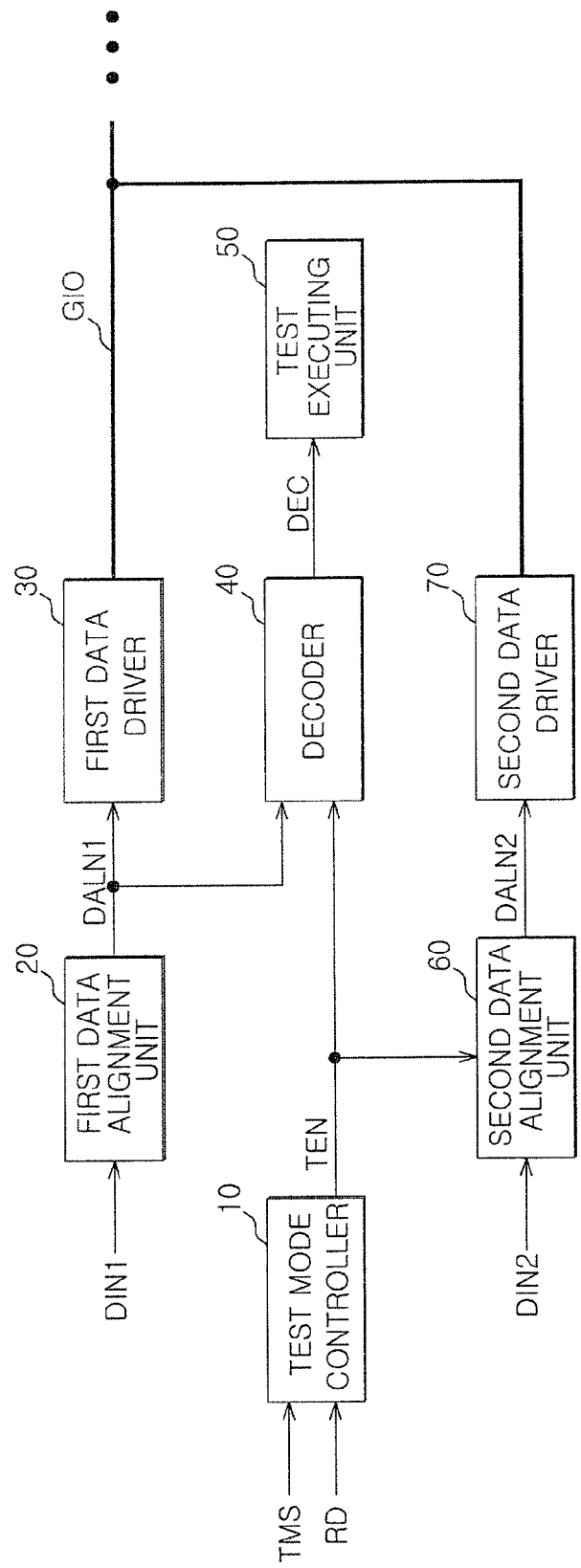
FIG. 1 is a block diagram showing a configuration of a semiconductor memory apparatus according to one embodiment.

FIG. 1 is a block diagram showing a configuration of a semiconductor memory device according to one embodiment.

As shown, a semiconductor memory apparatus according to one embodiment includes: a test mode controller 10 that generates a test enable signal 'TEN' in response to a test mode setting signal 'TMS' and a read command 'RD'; a first data alignment unit 20 that generates a first alignment data 'DALN1' by parallely aligning first input data 'DIN1' that is input in series; a first data driver 30 that drives the first alignment data 'DALN1' and transmits it to a global data bus 'GI0'; a decoder 40 that decodes the first alignment data 'DALN1' in response to the test enable signal 'TEN' to generate a decoding signal 'DEC'; a test executing unit 50 that executes preset test modes in response to the decoding signals 'DEC'; a second data alignment unit 60 that generates a second alignment data 'DALN2' by parallely aligning a second input data 'DIN2' that are input in series in response to the test enable signal 'TEN'; and a second data driver 70 that drives the second alignment data 'DALN2' and transmits it to a global data bus 'GIO'.

Herein, the test mode setting signal 'TMS' is a signal enabled according to a test mode defined by a mode register set circuit. The read command 'RD' is an internal read command that is generated inside the semiconductor memory apparatus by receiving an external read command. The test mode controller 10 enables the test enable signal 'TEN' when the test mode setting signal 'TMS' is enabled and disables the test enable signal 'TEN' when the read command 'RD' is enabled.

Each of the first input data 'DIN1' and the second input data 'DIN2' is serial data that include consecutive data bits. On the other hand, each of the first alignment data 'DALN1' and the second alignment data 'DALN2' are parallel data that includes a plurality of data bits to which each signal line is allocated. Each of the first data alignment unit 20 and the second data alignment unit 60 includes data input buffers (not shown), which buffers each bit of the first input data 'DIN1' and the second input data 'DIN2' when the test enable signal 'TEN' is disabled and aligns them in parallel to perform operations of general data input circuits that generates the first alignment data 'DALN1' and the second alignment data 'DALN2'.

However, when the test enable signal 'TEN' is enabled, the second data alignment unit 60 is deactivated. In this case, the first data alignment unit 20 maintains an activated state. Therefore, the first data alignment unit 20 can be performed as a unit that inputs the test codes.

Although one second data alignment unit 60 is shown herein, a plurality of second data alignment units may be provided. When the standard of the semiconductor memory apparatus is X4, three second data alignment units 60 are provided, when the standard of the semiconductor memory apparatus is X8, seven second data alignment units 60 are provided, and when the standard of the semiconductor memory apparatus is X16, fifteen second data alignment units 60 are provided.

In other words, in the semiconductor memory apparatus, when the test mode is executed, the plurality of second data alignment units 60 are deactivated together and the first data alignment unit 20 maintains an activation state. At this time, when the test codes of the plurality of bits are consecutively input through the first data alignment unit 20 from the outside of the semiconductor memory apparatus, this is aligned as the first alignment data 'DALN1' by the operation of the first data alignment unit 20.

The decoder 40 performs the decoding operation for the first alignment data 'DALN1' only when the test enable signal 'TEN' is enabled. When the test enable signal 'TEN' is enabled, the first alignment data 'DALN1' is a signal generated by aligning the test codes, such that the decoder 40 decodes the test code transmitted from the outside in the test mode to generate the decoding signal 'DEC'. Thereafter, the test executing unit 50 executes the test operation according to logic values owned by the decoding signal 'DEC'. The test executed by the test executing unit 50 may vary. For example, there may be a sense amplifier enable timing test, a power level test, a compress test, etc.

As described above, the semiconductor memory apparatus according to the embodiment transmits the test codes using a data input path in the test mode without separately including lines that transmit the test codes, such that unnecessary signal lines are removed, making it possible to improve area efficiency. In addition, in the test mode, the plurality of data alignment units to which the test codes are not input are deactivated and only one data alignment unit to which the test codes are input is activated, making it possible to suppress unnecessary power consumption. With the above-mentioned configuration, the integration of the semiconductor memory apparatus can be improved.

Figure 2:
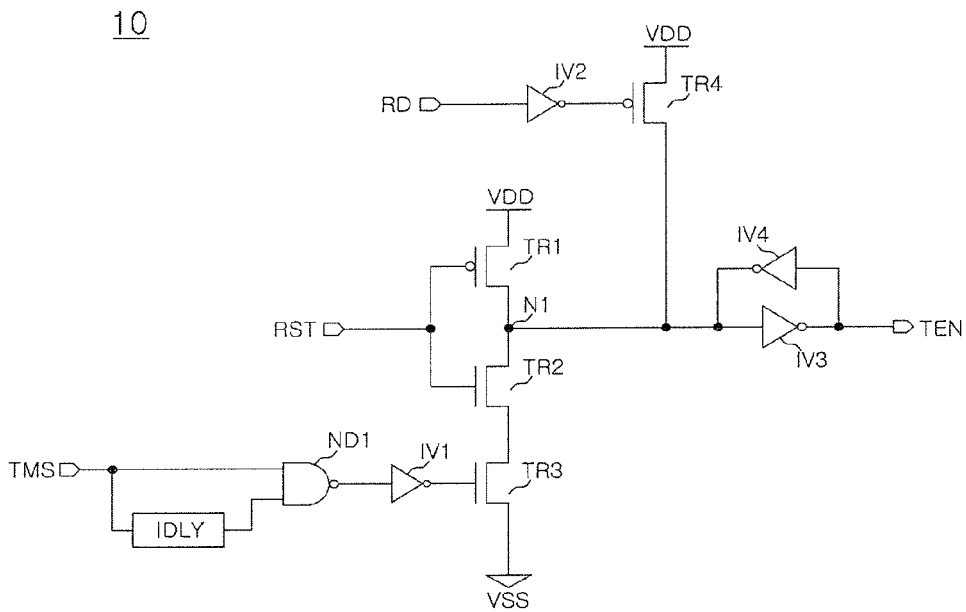
FIG. 2 is a detailed configuration diagram of a test mode controller shown in FIG. 1.

FIG. 2 is a diagram showing in detail a configuration of a test mode controller shown in FIG. 1.

As shown, the test mode controller 10 includes: an inverse delay unit 'IDLY' that inverts and delays the test mode setting signal 'TMS'; a first NAND gate 'ND1' that receives the test mode setting signal 'TMS' and the output signal of the inverse delay unit 'IDLY'; a first inverter 'IV1' that receives the output signal of the first NAND gate 'ND1'; a first transistor 'TR1' whose gate terminal is applied with a reset signal 'RST', source terminal is applied with external supply power 'VDD', and drain terminal is connected to a first node 'N1'; a second transistor 'TR2' whose gate terminal is applied with the reset signal 'RST' and drain terminal is connected to the first node 'N1'; a third transistor 'TR3' whose gate terminal is applied with the output signal of the first inverter 'IV1', drain terminal is connected to a source terminal of the second transistor 'TR2', and source terminal is connected to ground; a second inverter 'IV2' that receives the read command 'RD'; a fourth transistor 'TR4' whose gate terminal is applied with an output signal of the second inverter 'IV2', source terminal is applied with the external supply power 'VDD', and drain terminal is connected to the first node 'N1'; a third inverter 'IV3' that receives voltage formed at the first node 'N1' to output the test enable signal 'TEN'; and a fourth inverter 'IV4' that forms a latch structure together with the third inverter 'IV3'.

Herein, the reset signal 'RST' is a low enable signal and when the reset signal 'RST' is enabled, the voltage of the first node 'N1' becomes a high level and then, when the reset signal 'RST' is disabled, the second transistor 'TR2' is turned on but the voltage of the first node 'N1' is maintained. The output signal of the first inverter 'IV1' is implemented in a form of a pulse signal enabled at a high level when the test mode setting signal 'TMS' is enabled. When the output signal of the first inverter 'IV1' has voltage corresponding to a high level in the state where the second transistor 'TR2' is turned on, the voltage of the first node 'N1' is transited to a low level. Therefore, the test enable signal 'TEN' is enabled.

Thereafter, when the read command 'RD' is enabled, the fourth transistor 'TR4' is turned-on and thus, the voltage of the first node 'N1' is transited to a high level. Therefore, the test enable signal 'TEN' is disabled.

In other words, the test mode controller 10 enables the test enable signal 'TEN' when the test mode setting signal 'TMS' is enabled and then, performs an operation of maintaining an enable period of the test enable signal 'TEN' until the read command 'RD' is enabled.

Figure 3:
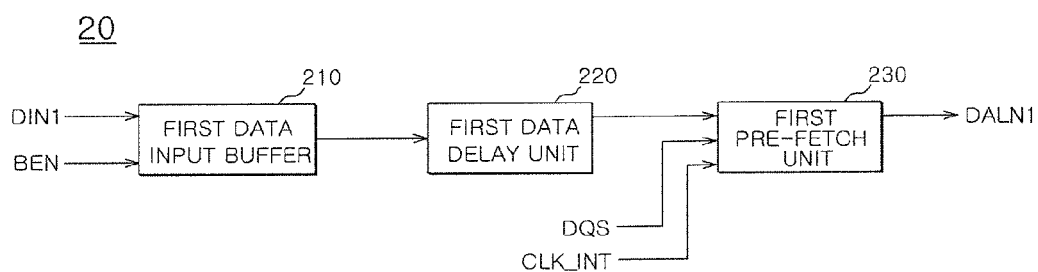
FIG. 3 is a detailed configuration diagram of a first data alignment unit shown in FIG. 1.

FIG. 3 is a detailed configuration diagram of the first data alignment unit shown in FIG. 1.

As shown, the first data alignment unit 20 includes a first data input buffer 210 that buffers the first input data 'DIN1' in response to a buffer enable signal 'BEN'; a first data delay unit 220 that delays data output from the first data input buffer 210; and a first pre-fetch unit 230 that parallely aligns the data transmitted from the first data delay unit 220 in response to a data strobe clock 'DQS' and an internal clock 'CLK_INT' to generate the first alignment data 'DALN1'.

With the configuration, the first data alignment unit 20 can perform an operation that buffers the first input data 'DIN1' when only the buffer enable signal 'BEN' is enabled regardless of whether the test mode is executed, aligns it in parallel, and outputs it as the first alignment data 'DALN1'. Therefore, the first data alignment unit 20 can provide a path through which a user can input the test codes in the test mode.

Figure 4:
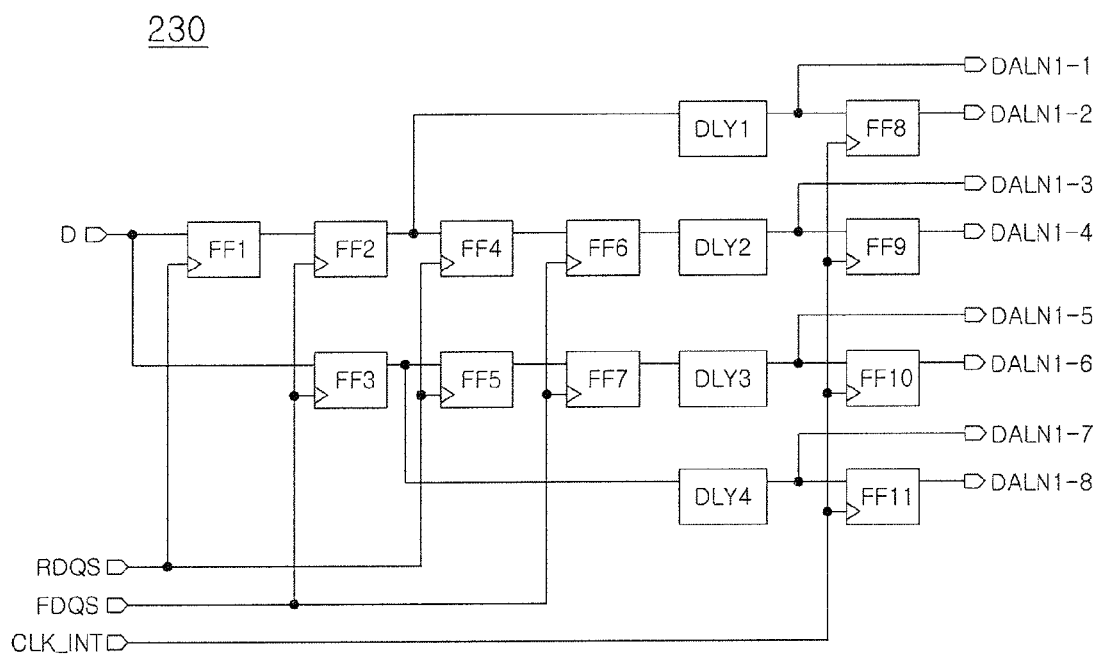
FIG. 4 is a detailed configuration diagram of a first free-fetch unit shown in FIG. 3.

FIG. 4 is a detailed configuration diagram of a first pre-fetch unit shown in FIG. 3.

Herein, the data strobe clock 'DQS' is implemented as a rising data strobe clock 'RDQS' and a falling data strobe clock 'FDQS'. The rising data strobe clock 'RDQS' and the falling data strobe clock 'FDQS' have a phase opposite to each other. In addition, the first alignment data 'DALN1' is represented as a 1-1 alignment data 'DALN1-1' to a 1-8 alignment data 'DALN1-8'. The data transmitted from the first data delay unit 220 is represented as a delay data 'D'.

As shown, the first pre-fetch unit 230 includes: a first flip-flop 'FF1' that latches the delay data 'D' in response to the rising data strobe clock 'RDQS'; a second flip-flop 'FF2' that latches the output signal of the first flip-flop 'FF1' in response to the falling data strobe clock 'FDQS'; a third flip-flop 'FF3' that latches the delay data 'D' in response to the falling data strobe clock 'FDQS'; a fourth flip flop 'FF4' that latches the output signal of the second flip-flop 'FF2' in response to the rising data strobe clock 'RDQS'; a fifth flip-flop 'FF5' that latches the output signal of the third flip-flop 'FF3' in response to the rising data strobe clock 'RDQS'; a sixth flip-flop 'FF6' that latches the output signal of the fourth flip-flop 'FF4' in response to the falling data strobe clock 'FDQS'; and a seventh flip-flop 'FF7' that latches the output signal of the fifth flip-flop 'FF5' in response to the falling data strobe clock 'FDQS'.

Further, the first pre-fetch unit 230 includes: a first delay unit 'DLY1' that delays the output signal of the second flip-flop 'FF2' to output the 1-1 alignment data 'DALN1-1'; a second delay unit 'DLY2' that delays the output signal of the sixth flip-flop 'FF6' to output the 1-3 alignment data 'DALN1-3'; a third delay unit 'DLY3' that delays the output signal of the seventh flip-flop 'FF7' to output the 1-5 alignment data 'DALN1-5'; a fourth delay unit 'DLY4' that delays the output signal of the third flip-flop 'FF3' to output the 1-7 alignment data 'DALN1-7'; an eighth flip-flop 'FF8' that latches the 1-1 alignment data 'DALN1-1' in response to the internal clock 'CLK_INT' to output the 1-2 alignment data 'DALN1-2'; a ninth flip-flop 'FF9' that latches the 1-3 alignment data 'DALN1-3' in response to the internal clock 'CLK_INT' to output the 1-4 alignment data 'DALN1-4'; a tenth flip-flop 'FF10' that latches the 1-5 alignment data 'DALN1-5' in response to the internal clock 'CLK_INT' to output the 1-6 alignment data 'DALN1-6'; and an eleventh flip-flop 'FF11' that latches the 1-7 alignment data 'DALN1-7' in response to the internal clock 'CLK_INT' to output the 1-8 alignment data 'DALN1-8'.

With the above configuration, the first pre-fetch unit 230 parallely aligns the delay data 'D' of 8 bits that are input in series and outputs it as the 1-1 alignment data 'DALN1-1' to the 1-8 alignment data 'DALN1-8'.

Figure 5:
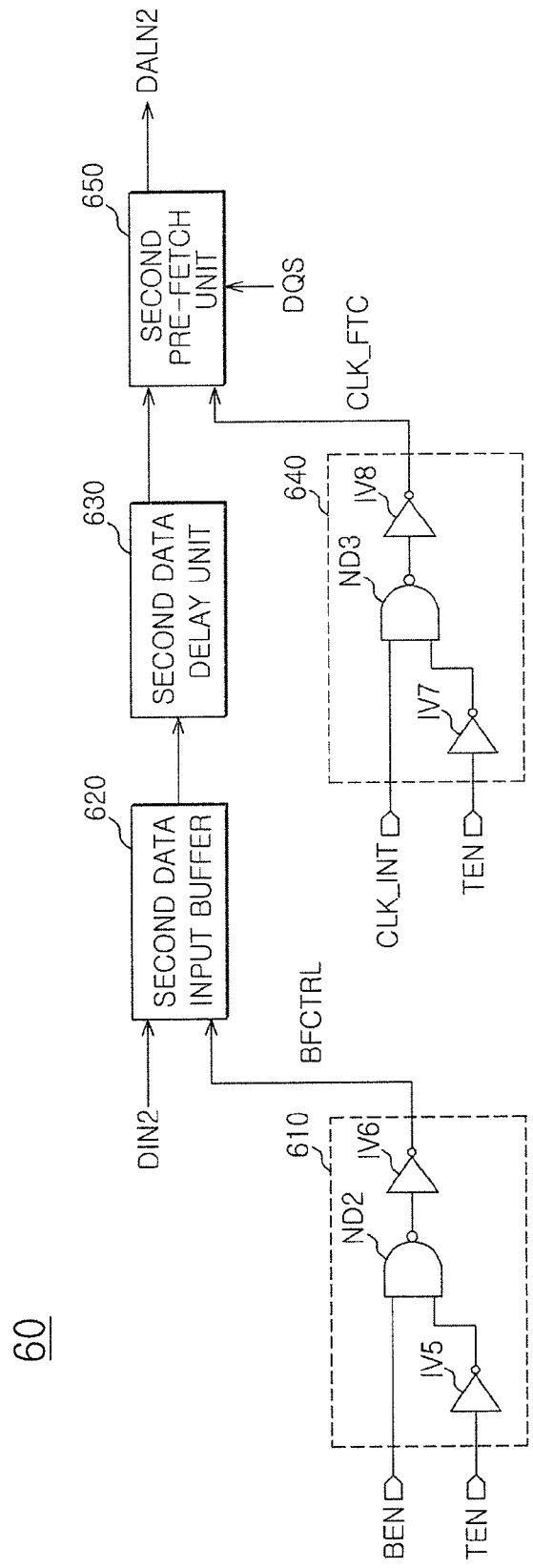
FIG. 5 is a detailed configuration diagram of a second data alignment unit shown in FIG. 1.

FIG. 5 is a detailed configuration diagram of a second data alignment unit shown in FIG. 1.

As shown, the second data alignment unit 60 includes: a buffer controller 610 that generates a buffer control signal 'BFCTRL' by combining the buffer enable signal 'BEN' and the test enable signal 'TEN'; a second data input buffer 620 that buffers the second input data 'DIN2' in response to the buffer control signal 'BFCTRL'; a second data delay unit 630 that delays data output from the second data input buffer 620; a fetch controller 640 that generates a fetch control clock 'CLK_FTC' by combining the test enable signal 'TEN' and the internal clock 'CLK_INT'; and a second pre-fetch unit 650 that parallely aligns data transmitted from the second data delay unit 630 in response to the data strobe clock 'DQS' and the fetch control clock 'CLK_FTC' to generate the second alignment data 'DALN2'.

The buffer controller 610 includes a fifth inverter 'IV5', a sixth inverter 'IV6', and a second NAND gate 'ND2' as shown. The buffer controller 610 enables the buffer control signal 'BFCTRL' when the buffer enable signal 'BEN' is enabled in the state where the test enable signal 'TEN' is disabled. However, the buffer controller 610 disables the buffer control signal 'BFCTRL' when the test enable signal 'TEN' is enabled. Therefore, the second data input buffer 620 can be operated only in a period where the test enable signal 'TEN' is disabled and stops the operation in a period where the test enable signal 'TEN' is enabled, that is, in the test mode, thereby suppressing the unnecessary power consumption.

The fetch controller 640 includes a seventh inverter 'IV7', an eighth inverter 'IV8', and a third NAND gate 'ND3' as shown. The fetch controller 640 non-inversely drives the internal clock 'CLK_INT' in the state where the test enable signal 'TEN' is disabled and generates the fetch control clock 'CLK_FTC'. However, the fetch controller 640 disables the fetch control clock 'CLK_FTC' when the test enable signal 'TEN' is enabled. Therefore, the second pre-fetch unit 650 can only be operated during a period where the test enable signal 'TEN' is disabled and stops the operation during the period where the test enable signal 'TEN' is enabled, that is, in the test mode, thereby suppressing the unnecessary power consumption.

It can be easily understood that the configuration of that the second pre-fetch unit 650 has the same form as the first pre-fetch unit 230 shown in FIG. 4. However, the second pre-fetch unit 650 is the same as the first pre-fetch unit 230 except that the second pre-fetch unit 650 is operated according to the control of the fetch control clock 'CLK_FTC' instead of the internal clock 'CLK_INT'.

As such, the second data alignment unit 60 has a structure that is deactivated in the test mode. Although a configuration of suppressing the power consumption in the data input path is shown herein, it is understood that a configuration of suppressing the power consumption during the test mode by applying the technical idea of the embodiment to the buffer of the data strobe clock 'DQS' (not shown) is also included in the scope of the present invention.

As described above, the semiconductor memory apparatus and the method of testing the same according to the disclosed embodiment enable the test enable signals in response to the test mode setting signal and then performs the operation of deactivating the operations of data alignment circuits other than one data alignment circuit in response to the enabled test enable signals. The signals output from the activated data alignment circuit are decoded and the test operation is executed in response to the decoded signals. Thereafter, when the read command is input, the test enable signals are disabled.

With the above-mentioned operations, the semiconductor memory apparatus and the method of testing the same according to the embodiment transmit the test codes using the data input path, such that the test modes can be applied without separately including lines that transmit the test codes, making it possible to increase area margin. In addition, all the paths except for the data input path that transmits the test codes in the test mode are deactivated, such that the loss of the power consumption cannot be increased. As a result, the embodiment provides a technical foundation that can greatly contribute to implement the high integration and low power consumption of the semiconductor memory apparatus.

Figure 6:
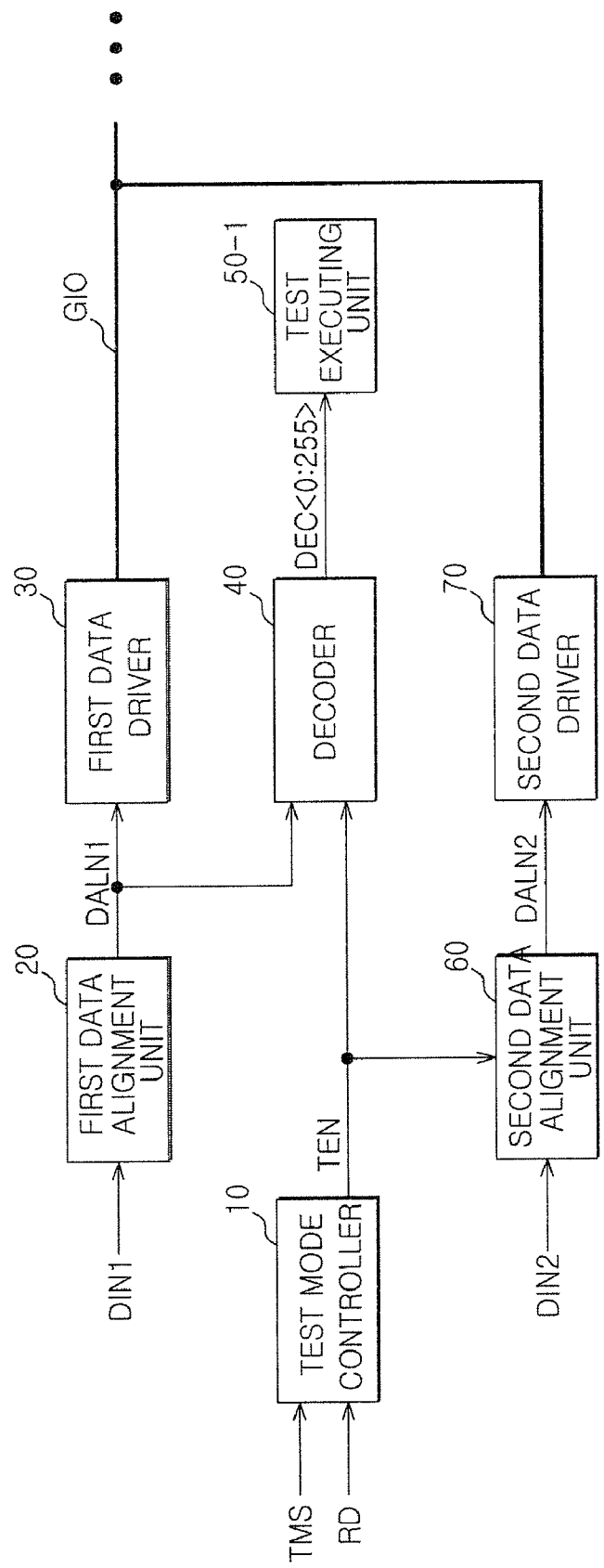
FIG. 6 is a block diagram showing a configuration of a semiconductor memory apparatus according to another embodiment.

FIG. 6 is a schematic configuration diagram of a semiconductor memory apparatus according to yet another embodiment. In addition, FIG. 6 is an embodiment showing that a semiconductor memory apparatus according to the embodiment can simultaneously perform a plurality of test modes.

The test mode controller 10, the first data alignment unit 20, the first data driver 30, the decoder 40, the second data alignment unit 60, and the second data driver 70 as shown in FIG. 6 have the same configuration as the test mode controller 10, the first data alignment unit 20, the first data driver 30, the decoder 40, the second data alignment unit 60, and the second data driver 70 as shown in FIG. 1. For convenience of explanation, although the output from the decoder 40 shown in FIG. 1 is shown as 'DEC', the output of the first data alignment unit 20 is 8, that is, 'DALN1-1 to DALN1-8' as shown in FIG. 4 and the output of the decoder 40 that decodes the outputs is substantially 256. In other words, the decoder 40 is configured to decode the eight outputs of the first data alignment unit 20 and enable one of 256 decoding signals 'DEC<0:255>'.

When one of first to 256-th decoding signals 'DEC<0:256>' is enabled, a test executing unit 50-1 shown in FIG. 6 is configured to execute a test mode corresponding thereto.

Figure 7:
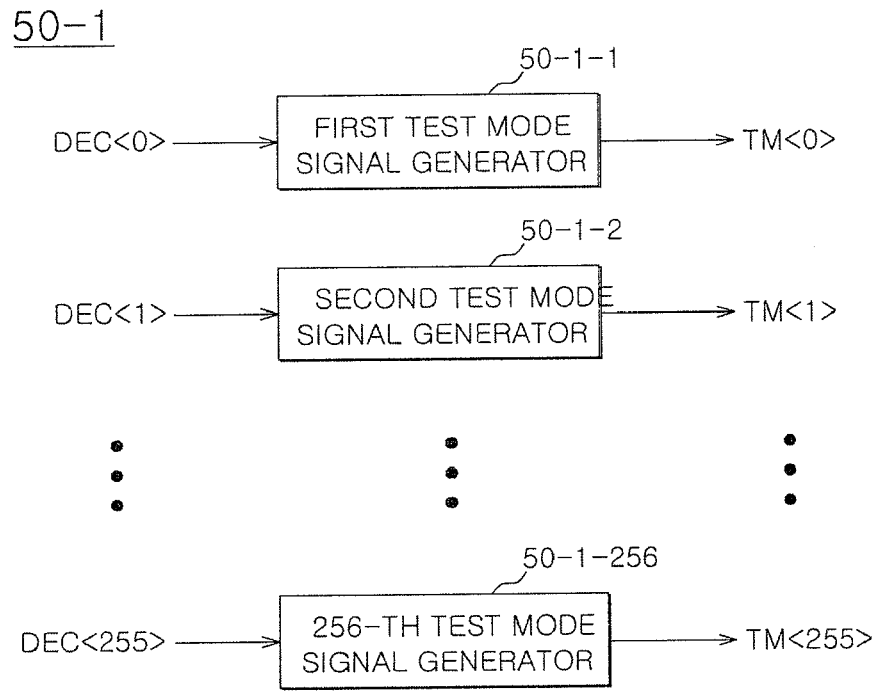
FIG. 7 is a configuration diagram of a test executing unit shown FIG. 6.

As shown in FIG. 7, The test executing unit 50-1 is configured to include a first to 256-th test mode signal generators 50-1-1 to 50-1-256 that enables each of a first to 256-th test mode signals 'TM<0:255>' in response to each of the first to 256-th decoding signals 'DEC<0:255>'. For example, the first test mod signal generator 50-1-1 enables the first test mode signal 'TM<0>' when the first decoding signal 'DEC<0>' is enabled.

The first to 256-th test mode signal generators 50-1-1 to 50-1-256 have the same configuration except that an input signal and an output signal thereof are different. Therefore, only the configuration of the first test mode signal generator 50-1-1 is described and the description of other test mode signal generators 50-1-2 to 50-1-256 will be omitted.

Figure 8:
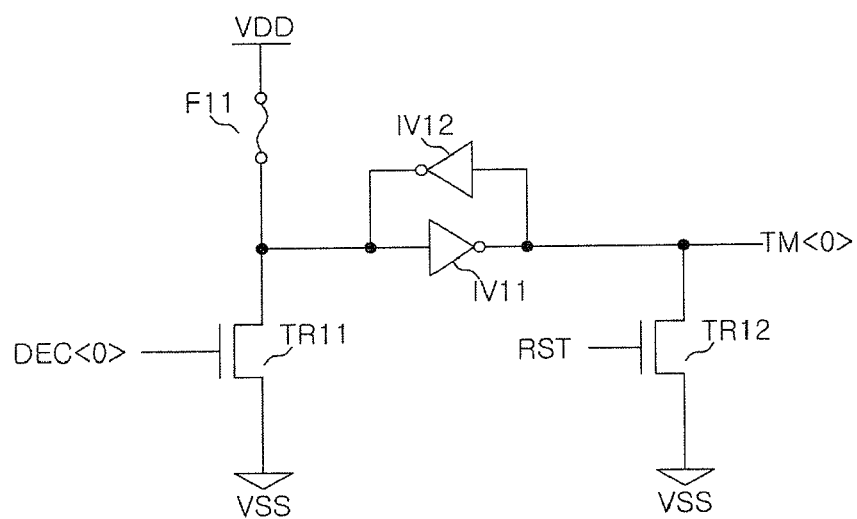
FIG. 8 is a detailed configuration diagram of a first test mode signal generator shown in FIG. 7.

As shown in FIG. 8, the first test mode signal generator 50-1-1 is configured to include fifth and sixth transistors 'TR11 and TR12', ninth and tenth inverters 'IV11 and IV12', and a fuse 'F11'. One terminal of the fuse 'F11' is applied with the external voltage 'VDD'. A drain of the fifth transistor 'TR11' is connected to the other terminal of the fuse 'F11', a gate thereof is applied with the first decoding signal 'DEC<0>', and a source thereof is connected to a ground terminal 'vss' The input terminal of the ninth inverter 'IV11' is connected to a node that is connected to the fuse 'F11' and a fifth transistor 'TR11'. The input terminal of the tenth inverter 'IV12' is connected to the output terminal of the ninth inverter 'IV11' and the output terminal thereof is connected to the input terminal of the ninth inverter 'IV11'. The gate of the sixth transistor 'TR12' is applied with a reset signal 'RST' and the drain thereof is connected to the output terminal of the tenth inverter 'IV12' and the source thereof is connected to the ground terminal 'VSS'. At this time, the tenth invert 'IV12' outputs the first test mode signal 'TM<0>'.

The above-mentioned first test mod signal generator 50-1-1 enables the first test mode signal 'TM<0>' at a high level when the first decoding signal 'DEC<0>' is enabled at a high level. In addition, the first test mode signal generator 50-1-1 maintains the enabled first test mode signal 'TM<0>' until the reset signal 'RST' is enabled to disable the first test mode signal 'TM<0>' at a low level. On the other hand, the first test mode signal generator 50-1-1 includes the fuse 'F11' to determine whether the first test mode signal 'TM<0> is enabled according to the cutting or not of the fuse 'F11' in order to use the test results after the test ends.

As described above, the semiconductor memory apparatus and the method of testing the same according to another embodiment enable the test enable signals in response to the test mode setting signals and then performs the operation of non-activating the operations of data alignment circuits other than one data alignment circuit in response to the enabled test enable signals. The signals output from the activated data alignment circuit are decoded and the test operations are executed by selecting one of 256 test operations in response to the decoded signals. As shown in FIG. 8, the test mode signal enabled in response to the decoded signal maintains the level until the reset signal is enabled. Therefore, other test mode signals can be enabled by decoding other combinations of signals output from the activated data alignment circuit without enabling the reset signal. In other words, the semiconductor memory apparatus and the method can simultaneously perform the plurality of test modes. When the test operation ends, the test enable signal is disabled by inputting a read command.

With the above-mentioned operations, the semiconductor memory apparatus and the method of testing the same according to the embodiment transmits the test codes using the data input path, such that the test modes can be applied without separately including lines that transmits the test codes, making it possible to increase area margin. In addition, all the paths except for the data input path that transmits the test codes in the test mode are non-activated, such that the loss of the power cannot be increased. As a result, the embodiment provides a technical foundation that can greatly contribute to implement the high integration and low power consumption of the semiconductor memory apparatus.

While certain embodiments have been described above, it will be understood to those skilled in the art that the embodiments described are by way of example only. The scope of the present invention is defined in the following claims and all changed or modified types derived from the meanings and scope of the claims and the equivalent concept thereof should be construed as being included in the scope of the present invention.

While certain embodiments have been described above, it will be understood that the embodiments described are by way of example only. Accordingly, the device and the method described herein should not be limited based on the described embodiments. Rather, the devices and methods described herein should only be limited in light of the claims that follow when taken in conjunction with the above description and accompanying drawings.

What is claimed is:

1. A semiconductor memory apparatus, comprising:
    a test mode controller configured to enable a test enable signal in response to an enabled test mode setting signal;
    a first data alignment unit configured to generate first alignment data by parallely aligning first input data that are input in series;
    a decoder configured to decode the first alignment data in response to the test enable signal to generate decoding signals;
    a test executing unit configured to execute preset test modes in response to the encoding signals; and
    a second data alignment unit configured to generate second alignment data by parallely aligning second input data that are input in series in response to a disabled test enable signal, and configured to be deactivated in response to the enabled test enable signal.

2. The semiconductor memory apparatus of claim 1, wherein the test mode controller disables the test enable signal when a read command is enabled.

3. The semiconductor memory apparatus of claim 1, wherein the first data alignment unit includes:
- a data input buffer configured to buffer the first input data in response to a buffer enable signal;
- a data delay unit configured to delay data output from the data input buffer; and
- a pre-fetch unit configured to parallely align the data transmitted from the data delay unit in response to a dta strobe clock and an internal clock to generate the first alignment data.

4. The semiconductor memory apparatus of claim 1, wherein the decoder is configured to perform a decoding operation on the first alignment data when the test enable signal is enabled.

5. The semiconductor memory apparatus of claim 1, wherein the second data alignment unit includes:
- a buffer controller configured to generate a buffer control signal by combining a buffer enable signal and the test enable signal;
- a data input buffer configured to buffer the second input data in response to the buffer control signal;
- a data delay unit configured to delay data output from the data input buffer;
- a fetch controller configured to generate a fetch control clock by combining the test enable signal and an internal clock; and
- a pre-fetch unit configured to parallely align data transmitted from the data delay unit in response to a data strobe clock and the fetch control clock to generate the second alignment data.

6. The semiconductor memory apparatus of claim 1, wherein the first alignment data and the second alignment data are transmitted to a global data bus simultaneously when the test enable signal is disabled.

* * * * *